United States Patent
Higuchi

(10) Patent No.: US 8,324,735 B2
(45) Date of Patent: Dec. 4, 2012

(54) SEMICONDUCTOR DEVICE

(75) Inventor: Koji Higuchi, Ibaraki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 73 days.

(21) Appl. No.: 12/621,012

(22) Filed: Nov. 18, 2009

(65) Prior Publication Data

US 2010/0127406 A1     May 27, 2010

(30) Foreign Application Priority Data

Nov. 21, 2008 (JP) ................................ 2008-297814

(51) Int. Cl.
    *H01L 23/48* (2006.01)

(52) U.S. Cl. ........ 257/775; 257/776; 257/784; 257/786; 257/773; 257/E23.01; 257/E23.141

(58) Field of Classification Search ................... 257/775, 257/776
See application file for complete search history.

(56) References Cited

U.S. PATENT DOCUMENTS

| | | | |
|---|---|---|---|
| 6,433,422 B1 * | 8/2002 | Yamasaki .................. | 257/725 |
| 6,538,332 B2 * | 3/2003 | Murayama et al. .......... | 257/777 |
| 6,686,615 B1 * | 2/2004 | Cheng et al. ................ | 257/208 |
| 7,928,580 B2 * | 4/2011 | Saito ........................... | 257/775 |

FOREIGN PATENT DOCUMENTS

| | | |
|---|---|---|
| JP | 2006-080167 | 3/2006 |
| JP | 2007-163913 | 6/2007 |

* cited by examiner

*Primary Examiner* — Fei Fei Yeung Lopez
(74) *Attorney, Agent, or Firm* — Taft Stettinius & Hollister LLP

(57) ABSTRACT

There is provided a semiconductor device including: plural first output pads formed along one edge of an outer periphery of a substrate; plural second output pads formed along at least one of an edge at an opposite side of the substrate from the one edge, and an edge adjoining the one edge; plural internal circuits, each of which is provided with an output terminal connected with an output pad of one of the first output pads and the second output pads; plural first lines, each of which connects one of the output terminals of the internal circuits with one of the plurality of first output pads; and plural second lines, each of which connects one of the output terminals of the internal circuits with one of the plural second output pads, resistance values per unit of wiring length being lower in the second lines than in the first lines.

12 Claims, 5 Drawing Sheets

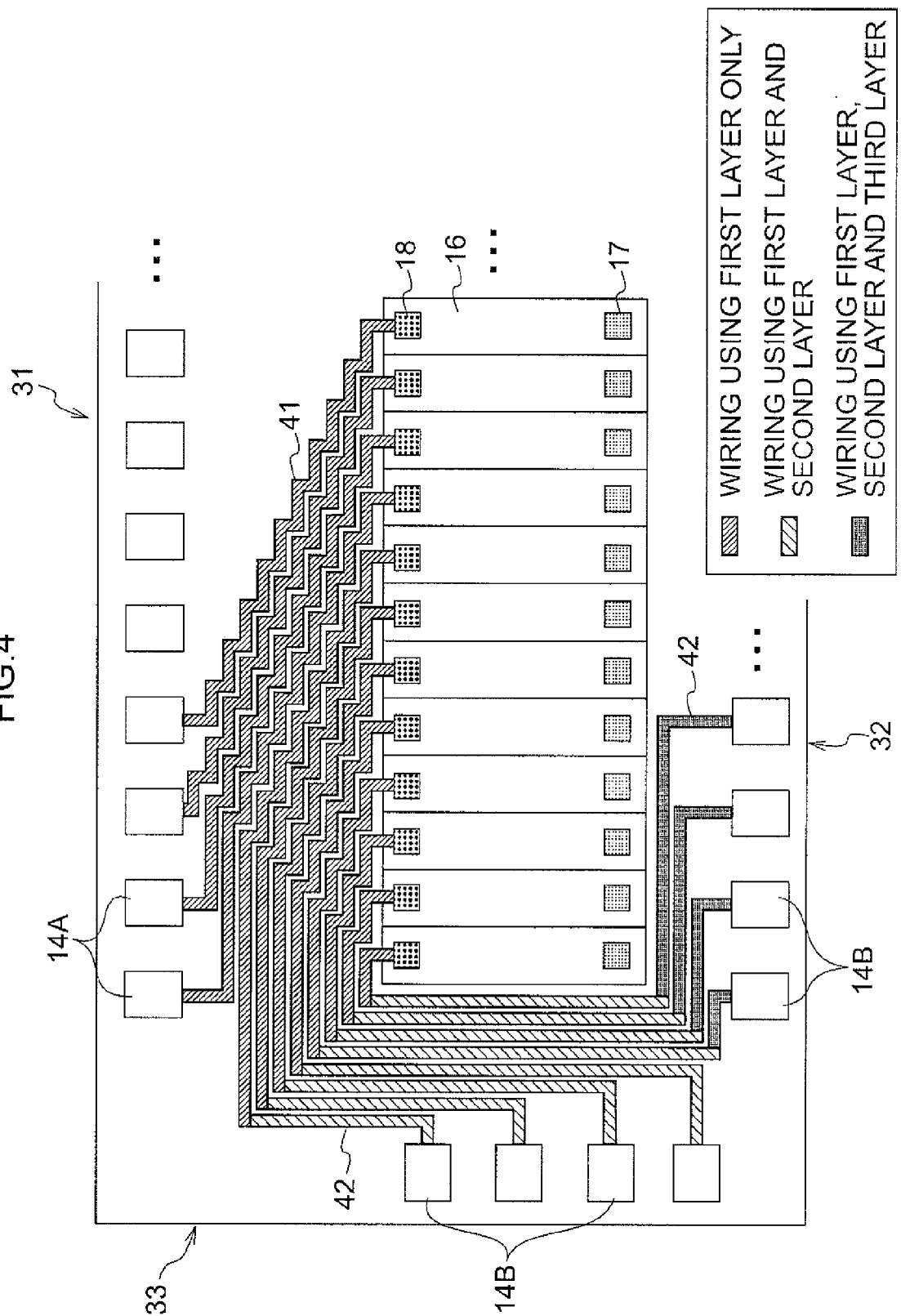

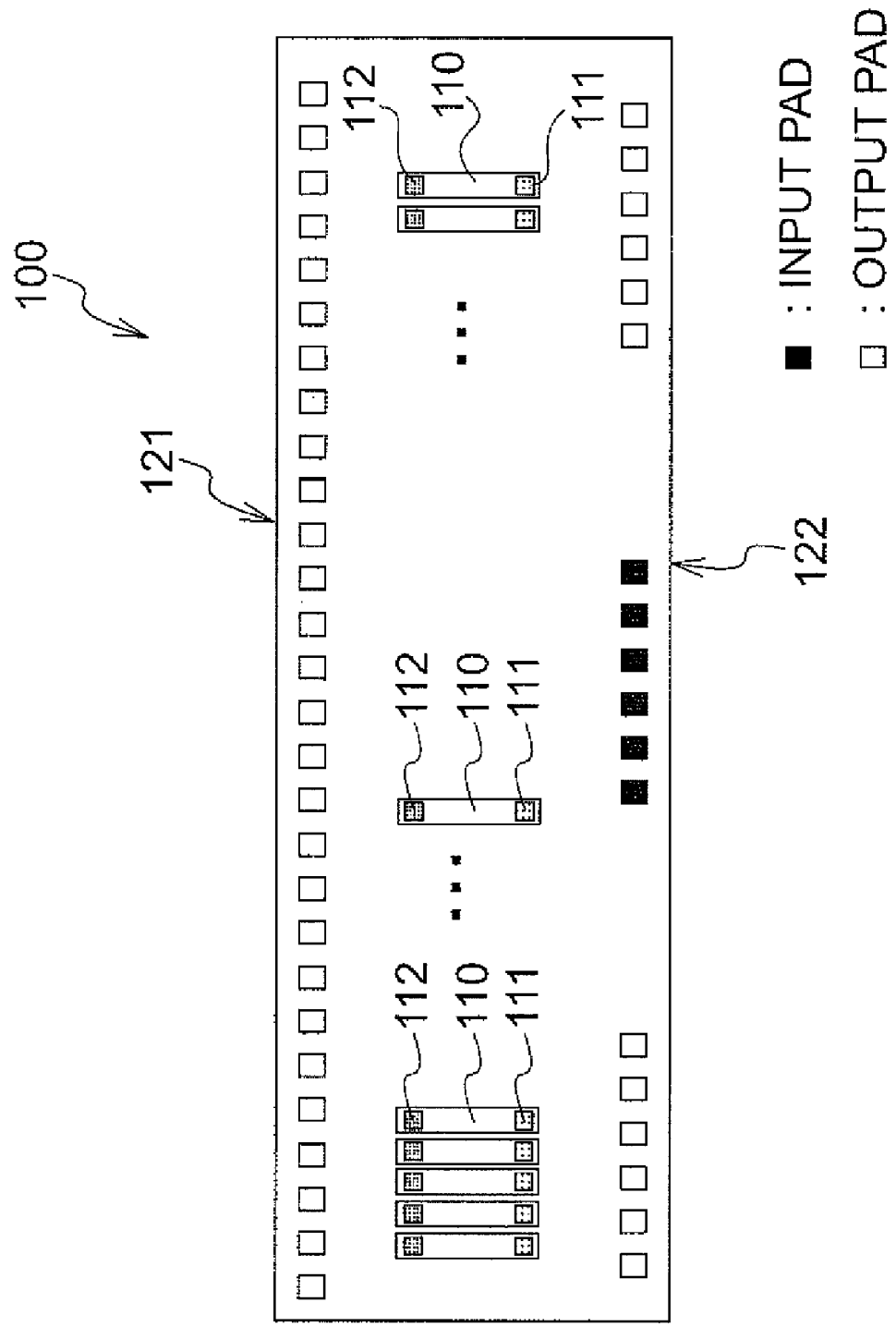

SEMICONDUCTOR DEVICE

CROSS-REFERENCE TO RELATED APPLICATIONS

This application is based on and claims priority under 35 U.S.C. §119 from Japanese Patent Application No. 2008-297814 filed on Nov. 21, 2008, the disclosure of which is incorporated by reference herein.

RELATED ART

1. Field of the Disclosure

The present invention relates to a semiconductor device, and more particularly, to a semiconductor device at which output pads are arranged along plural edges of an outer periphery of the semiconductor device.

2. Description of the Related Art

Drivers that control driving of pixels are installed in a display apparatus. In recent years, as display apparatuses have increased in size and become higher in definition, and the numbers of drivers installed have fallen, there has been a trend for the number of outputs from each driver to increase. The number of outputs is commonly 480 or 720, but there are now calls for drivers in the 960-output class.

A driver is formed being provided with an IC chip (a semiconductor device). As the number of outputs increases, a need arises for plural output pads, through which output signals are outputted to an external display panel, to be arranged not just along one edge of an outer periphery of the semiconductor device but also along other edges.

The output pads are formed in a number of at least a number of internal circuits provided in the semiconductor device (which are circuits that generate output signals from input signals and output the output signals to the output pads). A pitch between the output pads is wider than a pitch between output terminals that are provided at the internal circuits. Therefore, if the output pads are arranged along only one side of the semiconductor device, the area of the semiconductor device increases. Accordingly, attempts have been made to form output pads along plural edges of the output periphery of a semiconductor device and suppress increases in area of the semiconductor devices. Input pads, through which input signals are inputted from outside to the internal circuits, are shared by plural internal circuits (for example, switching is performed and respective input signals are inputted at staggered times or the like). Therefore, the number of input pads can be kept smaller than the number of output pads.

FIG. 5 is a diagram illustrating an example of arrangement of output pads. As illustrated in FIG. 5, plural output pads are formed along one edge 121 (hereinafter referred to as the first edge 121) of an output periphery of a semiconductor device 100. Further, plural input pads are formed along an edge 122 (hereinafter referred to as the second edge 122) at the opposite side of the semiconductor device 100 from the first edge 121, at a middle portion in the direction of extension of the second edge 122. In addition, plural output pads are formed along the second edge 122, at the two end portions in the direction of extension of the second edge 122.

As is also illustrated in FIG. 5, plural internal circuits 110 are formed at a central portion of the semiconductor device 100. The internal circuits 110 are arranged in a certain direction such that respective output terminals 112 thereof line up along the first edge 121 side thereof. The output terminals 112 of the internal circuits 110 are connected with the output pads by wiring, and input terminals 111 of the internal circuits 110 are connected with the input pads by wiring (the wiring is not illustrated in this drawing).

Now, in order to connect the output terminals 112 of the internal circuits 110 with those output pads that are formed along the second edge 122, wiring must be formed that is routed around the group of internal circuits. Consequently, wiring lengths are longer and wiring resistances increase.

As a result, there are variations in the lengths of the lines connecting the output terminals 112 of the internal circuits 110 with the output pads, and there are variations in wiring resistances.

Accordingly, a liquid crystal display driver has been disclosed, in Japanese Patent Application Laid-Open (JP-A) No. 2007-163913, with the objective of preventing an increase in chip size. Specifically, liquid crystal panel signal lines in the liquid crystal display driver are successively grouped into sets of an integer multiple of three. At two adjacent groups, a pair of positive and negative decoders for gradation voltage selection and a pair of positive and negative output amplifiers are provided. Further, switches that connect and disconnect the image signals are provided in correspondence with the liquid crystal panel signal lines. A switching circuit, which switches between directly passing and crossing over signals that are being propagated, is provided between the switches and the output amplifiers, preceding the decoders. Hence, it is possible to prevent an increase in chip size.

Further, in JP-A No. 2006-80167, a semiconductor device is disclosed in which connection wiring that connects with a wiring pattern is formed on an insulating film, semiconductor device surface bumps are formed at portions other than a peripheral edge portion of the semiconductor device, and the connection wiring connects between the semiconductor device surface bumps and the wiring pattern. Furthermore, semiconductor device surface bumps are connected with other semiconductor device surface bumps.

However, because the technology described in JP-A No. 2007-163913 has a constitution in which, as mentioned above, the liquid crystal panel signal lines are grouped and the decoders and output amplifiers are provided in correspondence therewith, the structure thereof is dependent on the liquid crystal panel, and preventing an increase in chip size at the semiconductor device level may not be achieved.

Further, with the technology described in JP-A No. 2006-80167, although the number of routed-around lines may be reduced, no way is given to suppress resistance values of lines that are routed around.

INTRODUCTION TO THE INVENTION

The present invention is proposed in order to solve the problem described above, and an object of the present invention is to provide a semiconductor device in which wiring resistances of wiring that connects output pads formed at the semiconductor device with output terminals of internal circuits may be suppressed.

In order to achieve the object described above, the present invention provides a semiconductor device including:

a plurality of first output pads formed along one edge of an outer periphery of a substrate;

a plurality of second output pads formed along at least one of an edge at an opposite side of the substrate from the one edge, and an edge adjoining the one edge;

a plurality of internal circuits, each of which is provided with an output terminal connected with an output pad of one of the first output pads and the second output pads, the plural internal circuits being formed along the one edge at a central portion of the substrate such that the output terminals are respectively arranged along a side of the internal circuits at which the one edge is disposed;

a plurality of first lines, each of which connects one of the output terminals of the plurality of internal circuits with one of the plurality of first output pads; and a plurality of second lines, each of which connects one of the output terminals of the plurality of internal circuits with one of the plurality of second output pads, resistance values per unit of wiring length being lower in the second lines than in the first lines.

Because the first lines are formed without detouring around other internal circuits, wiring lengths can be kept short, and because the second lines are formed to be routed so as to detour around other internal circuits, wiring lengths thereof are longer than for the first lines and wiring resistance values are greater. Accordingly, the overall wiring resistances of the second lines may be suppressed by forming the second lines such that the resistance values per unit of wiring length thereof are made lower than in the first lines.

The plural second lines may be formed such that line widths per unit of wiring length, in other words average line widths, of the plural second lines are wider than line widths per unit of wiring length of the plural first lines. In this case, the plural second lines may be formed such that the line widths are broader in regions in which wiring densities are lower.

Further, plural wiring layers may be laminated on the substrate, and the plural second lines formed such that numbers of the wiring layers used for forming the plural second lines are greater than numbers of the wiring layers used for forming the plural first lines. In this case, the plural second lines may be formed such that the numbers of the wiring layers that are used are greater in regions in which wiring densities are lower.

Further, the plural second lines may be formed such that line thicknesses per unit of wiring length (average thicknesses) of the plural second lines are greater than line thicknesses per unit of wiring length (average thicknesses) of the plural first lines.

Further, the plural second lines may be formed of a material with a lower resistivity than the plural first lines.

According to the present invention as described above, an effect is provided in that wiring resistances of wiring that connects output pads formed at a semiconductor device with output terminals of internal circuits may be suppressed.

BRIEF DESCRIPTION OF THE DRAWINGS

Exemplary embodiments of the present disclosure will be described in detail based on the following figures, wherein:

FIG. 4 is a diagram illustrating a structural example of a semiconductor device relating to a second exemplary embodiment; and FIG. 5 is a diagram illustrating an example of arrangement of input pads, output pads and internal circuits in a semiconductor device.

DETAILED DESCRIPTION

The exemplary embodiments of the present disclosure are described and illustrated below to encompass a semiconductor device and, more particularly, to a semiconductor device at which output pads are arranged along plural edges of an outer periphery of the semiconductor device. Of course, it will be apparent to those of ordinary skill in the art that the preferred embodiments discussed below are exemplary in nature and may be reconfigured without departing from the scope and spirit of the present disclosure. However, for clarity and precision, the exemplary embodiments as discussed below may include optional steps, methods, and features that one of ordinary skill should recognize as not being a requisite to fall within the scope of the present disclosure.

-First Exemplary Embodiment-

Figure 1:
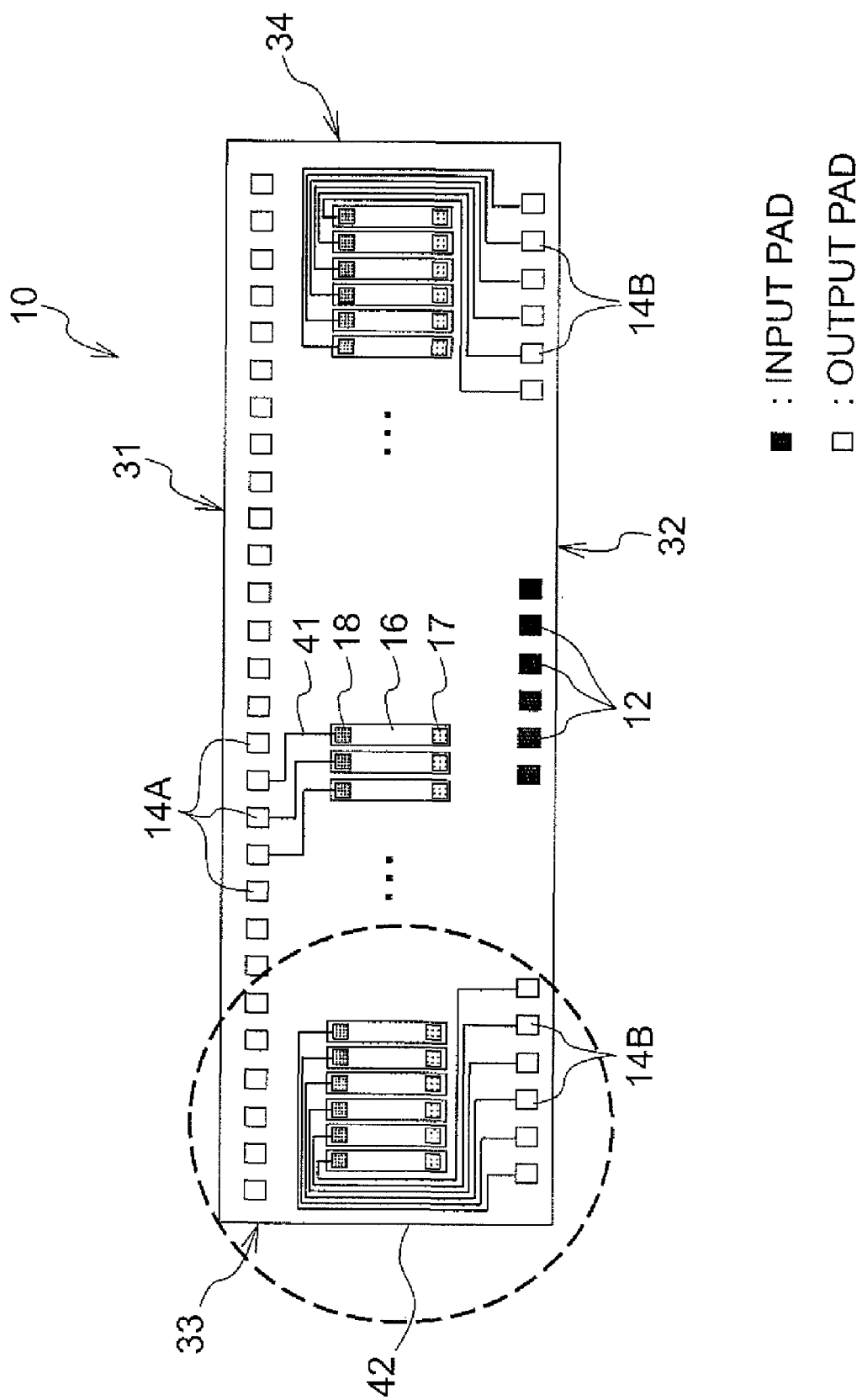
FIG. 1 is a diagram illustrating a structural example of a semiconductor device relating to a first exemplary embodiment.

FIG. 1 is a diagram illustrating a structural example of a semiconductor device 10 relating to the present exemplary embodiment.

As illustrated in FIG. 1, the semiconductor device 10 relating to the present exemplary embodiment is rectangular, and an outer periphery thereof has a long rectilinear shape with a pair of long edges and a pair of short edges. In the present exemplary embodiment, one of the pair of long edges (the edge arranged at the upper side in FIG. 1) is referred to as a first edge 31, and the edge at the opposite side from the first edge 31 is referred to as a second edge 32. One of the pair of short edges (the edge arranged at the left side in FIG. 1) is referred to as a third edge 33, and an edge at the opposite side from the third edge 33 is referred to as a fourth edge 34.

A plural number of output pads are formed in a region along the first edge 31, and a plural number of input pads are formed along the second edge 32 at a middle portion of the direction of extension of the second edge 32 opposite from the first edge 31. Furthermore, a plural number of output pads are formed along the second edge 32 at the two end portions of the direction of extension of the second edge 32.

Hereinafter, the output pads that are formed along the first edge 31 are referred to as first output pads 14A, and the output pads that are formed along one or more of the other three edges—the second edge 32 opposite from the first edge 31 and the adjacent third edge 33 and fourth edge 34—(i.e., in the example illustrated in FIG. 1, the output pads formed along the second edge 32) are distinguishingly referred to as second output pads 14B. The first output pads 14A and the second output pads 14B respectively have the same structures and the same functions, and when being discussed without particularly being distinguished, will be referred to as output pads 14, with the appended letter being omitted from the reference numeral.

As illustrated in FIG. 1, plural internal circuits 16 are formed at a central portion of the semiconductor device 10. Each internal circuit 16 is provided with an input terminal 17 and an output terminal 18. Each input terminal 17 is connected to one of plural input pads 12. Each output terminal 18 is connected to one of the plural output pads 14. The internal circuit 16 generates an output signal based on an input signal inputted through the input pad 12, and outputs the output signal to the output pad 14 that is connected to the output terminal 18. The plural internal circuits 16 are formed to be arranged along the first edge 31 in a certain orientation, such that the respective output terminals 18 are arrayed along the first edge 31 side of the internal circuits 16.

In the present exemplary embodiment, each of plural lines that each connect one of the plural output terminals 18 of the internal circuits 16 with one of the first output pads 14A is referred to as a first line 41, and each of plural lines that each connect one of the plural output terminals 18 of the internal circuits 16 with one of the second output pads 14B is referred to as a second line 42. Wiring connecting the input pads 12 with the input terminals 17 is not illustrated in FIG. 1.

As illustrated in FIG. 1, the first lines 41 are lines that connect the first output pads 14A formed along the first edge 31 with the output terminals 18 arranged along the first edge 31 side. Therefore, the first lines 41 are formed without detouring around others of the internal circuits 16. Thus, wiring lengths are kept short. In contrast, the second lines 42 are lines that connect the second output pads 14B formed along the second edge 32 with the output terminals 18 arranged along the first edge 31 side. Therefore, the second lines 42 are formed to be routed so as to detour around others of the internal circuits 16. Thus, the wiring lengths are longer and wiring resistance values are greater.

In the present exemplary embodiment, in order to suppress variations between the wiring resistances, which are caused by variations between the wiring lengths, the plural second lines 42 are formed as described herebelow, and a wiring resistance value per unit of wiring length for each of the second lines 42 is made lower than for the plural first lines 41.

Figure 2:
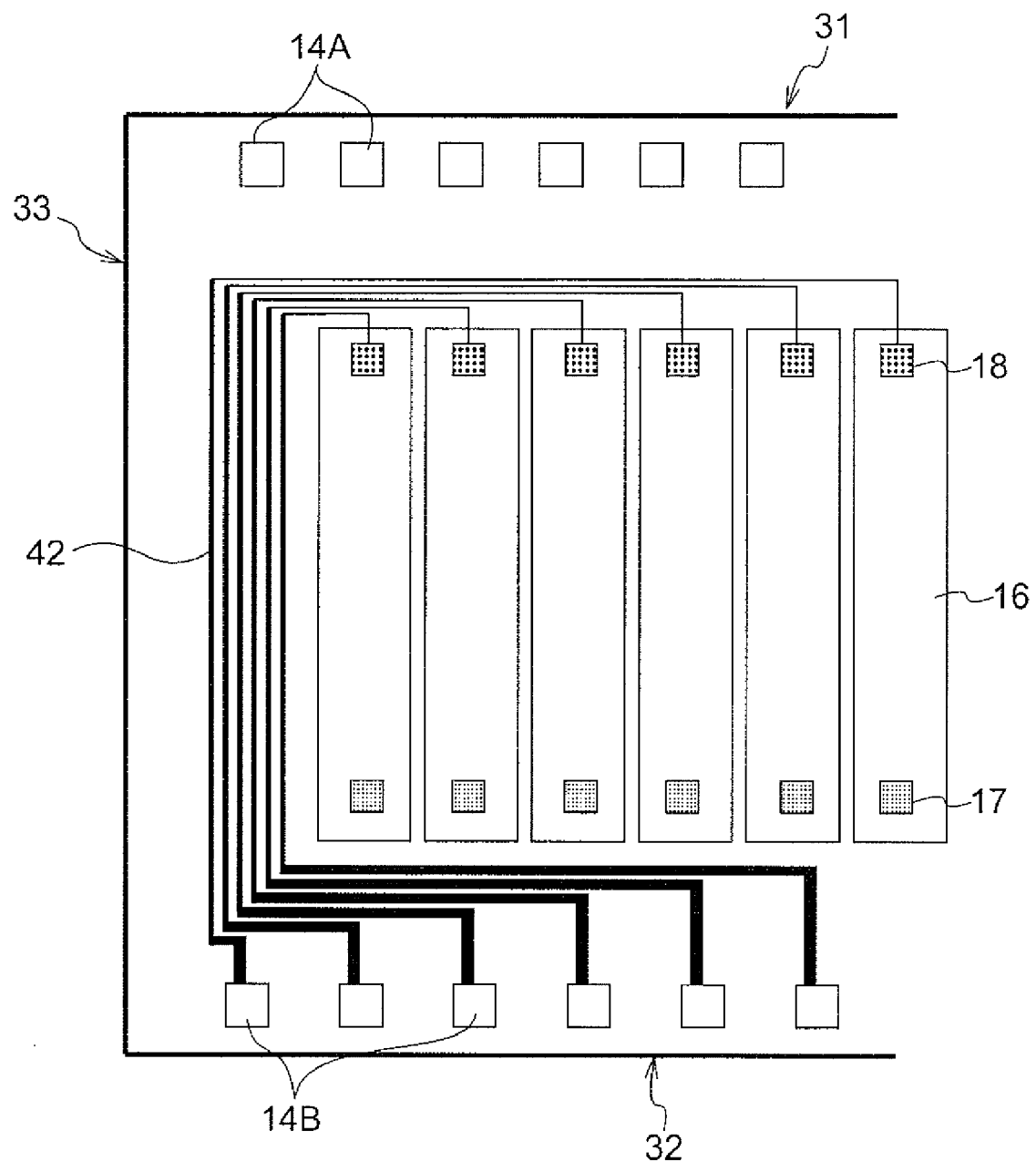
FIG. 2 is a magnified diagram in which a portion enclosed by a dotted line in FIG. 1 is magnified.

FIG. 2 is a magnified diagram in which a portion enclosed by a dotted line in FIG. 1 is magnified.

In the present exemplary embodiment, each second line 42 is formed so as to have a fatter line width than a line width of each first line 41, on average. That is, a line width for a unit of wiring length of each second line 42 is formed to be broader than a line width for a unit of wiring length of each first line 41.

In the present exemplary embodiment, the line width of each second line 42 is formed so as to be fatter for wiring in regions closer to the second edge 32. That is, as illustrated in FIG. 2, line widths of the second lines 42 in a region along the third edge 33 are formed to be broader than line widths in a region along the first edge 31, and line widths of the second lines 42 in a region along the second edge 32 are formed to be broader than the line widths in the region along the third edge 33.

Of the regions in which the routed-around wiring of the second lines 42 is disposed, the region along the two ends of the edge at the side at which the input pads 12 are arranged (the second edge 32) is a region in which the wiring density is particularly low (sparse). Therefore, because there is free space, the wiring may be formed with the line widths being fatter without causing the chip size to increase. Further, the region along the third edge 33 is a region in which the wiring density is lower (sparser) than in the region along the first edge 31, in which the wiring density is high because of the formation of the first lines 41 connecting the first output pads 14A with the output terminals 18. Therefore, line widths in the region along the third edge 33 may be formed to be fatter than in the region along the first edge 31.

Further, although not illustrated in FIG. 2, the first lines 41 that connect the output terminals 18 with the first output pads 14A are formed in the region along the first edge 31 in which the wiring density is high. Therefore, the first lines 41 are formed with substantially the same narrow line widths as the line widths of the second lines 42 in the region along the first edge 31.

This wiring constitution is formed using widely known lithography technology, and a fine wiring pattern is formed by etching.

Now, overall wiring resistance values R are obtained by the following equations (1) and (2).

$$R = L \times r \quad (1)$$

$$r = \rho / (W \times H) \quad (2)$$

In which r is a wiring resistance value per unit of wiring length, ρ is the resistivity, L is a wiring length, W is a line width, and H is a wiring height (line thickness).

Therefore, even though the wiring lengths L of the second lines 42 are longer, the wiring resistance values can be suppressed by forming the second lines 42 with the line widths W being wider such that the wiring resistance values per unit wiring length are lower than in the first lines 41.

Figure 3:
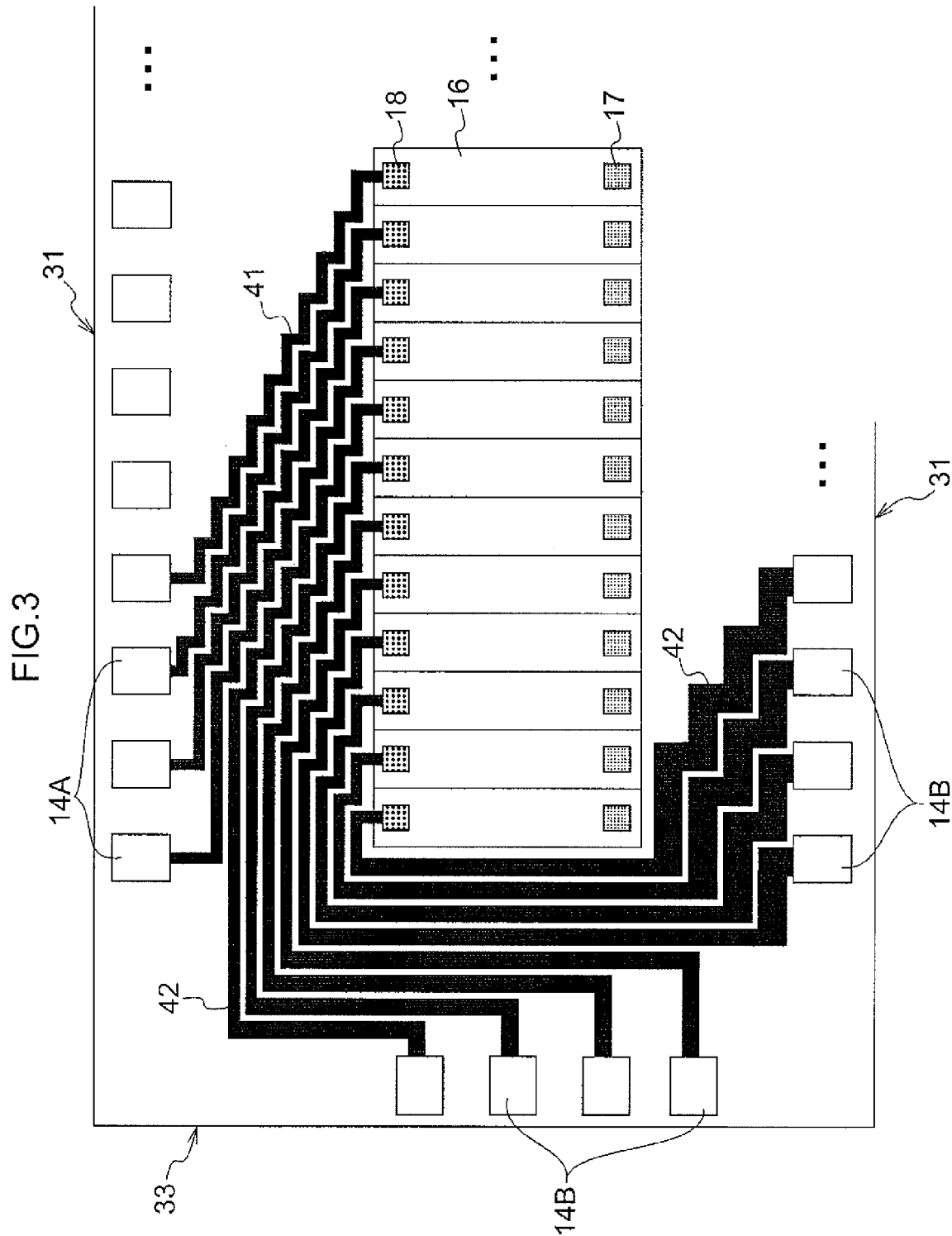
FIG. 3 is a diagram illustrating a structural example of a semiconductor device.

FIG. 3 is a diagram illustrating another structural example of a semiconductor device. In this structural example, the output pads 14 are formed in a region of the outer periphery of the semiconductor device along the third edge 33 as well as in the regions along the first edge 31 and the second edge 32. The output pads 14 formed in the region along the third edge 33 are also referred to as the second output pads 14B. Similarly to the above descriptions, respective lines connecting the second output pads 14B with the output terminals 18 are referred to as the second lines 42.

In this structural example too, the second lines 42 connecting the output terminals 18 of the internal circuits 16 with the second output pads 14B are formed to be fatter than the line widths of the first lines 41 on average. That is, the line widths for a unit of wiring length of the second lines 42 are formed to be wider than the line widths for a unit of wiring length of the first lines 41. Further, in this structural example too, the line width of each second line 42 is formed so as to be fatter for wiring in regions closer to the second edge 32. That is, as illustrated in FIG. 3, the line widths of the second lines 42 in the region along the third edge 33 are formed to be broader than the line widths in the region along the first edge 31, and the line widths of the second lines 42 in the region along the second edge 32 are formed to be broader than the line widths in the region along the third edge 33.

With this structure too, the same effect as described above is provided.

If the second output pads 14B are formed along the fourth edge 34 too, the same effect as described above is provided by forming the second lines 42 to have broader line widths as described above.

The present invention is not to be limited by the semiconductor device of the above-described exemplary embodiment. For example, line widths may be widened only in the region along the second edge 32, with line widths in the region along the third edge 33 not being widened.

-Second Exemplary Embodiment-

In the first exemplary embodiment, an example has been described in which the second lines 42 are formed such that line widths per unit of wiring length of the second lines 42 are broader than line widths per unit of wiring length of the first lines 41. In the present exemplary embodiment, an example is described in which the second lines 42 are formed using plural wiring layers and wiring resistances are suppressed.

A semiconductor device commonly has a multilayer structure in which plural wiring layers are laminated on a silicon substrate. Using these plural wiring layers, numbers of wiring layers used in formation of the second lines 42 are made greater than numbers of wiring layers used in formation of the first lines 41. As a result, wiring resistance values per unit of wiring length of the second lines 42 may be suppressed lower.

FIG. 4 illustrates a structural example of a semiconductor device of the present exemplary embodiment. In this structural example, the second output pads 14B are formed in the region of the outer periphery of the semiconductor device along the third edge 33 as well as in the regions along the first edge 31 and the second edge 32. Apart from the arrangement of the output pads 14 and a process of wiring the second lines 42, the structure is the same as in FIG. 1 of the first exemplary embodiment so further descriptions will not be given here.

As illustrated in FIG. 4, the first lines 41 and portions of the second lines 42 are formed in the region along the first edge 31 (herebelow, a "first region") using only an uppermost layer (a first layer) of the laminated plural wiring layers.

Portions of the second lines 42 in the region along the third edge 33 (herebelow, a "third region") are formed using the first layer and a wiring layer below the first layer (a second layer).

More specifically, at each of pre-specified branching positions on the wiring paths of the second lines 42 in the third region, through-holes for connecting the first layer and the second layer are formed. Each second line 42 that has been routed around from the first region on the first layer branches from the branching position and is also formed on the second layer. Hence, each second line 42 is formed in a state in which wiring on the first layer and wiring on the second layer are in parallel in a vertical direction (the direction of lamination of the plural wiring layers).

Portions of the second lines 42 in the region along the second edge 32 (herebelow, a "second region") are formed using the first layer, the second layer and a wiring layer below the second layer (a third layer).

More specifically, at each of pre-specified branching positions on the wiring paths of the second lines 42 in the second region, through-holes for connecting the first layer, the second layer and the third layer are formed. Similarly to the above description, each second line 42 is formed to branch onto the three layers—the first layer to the third layer. Hence, each second line 42 is formed in a state in which wiring in the first layer, wiring in the second layer and wiring in the third layer are in parallel in the vertical direction (the direction of lamination of the plural wiring layers).

To connect the end portion of each second line 42 with the second output pad 14B, it is necessary to combine (short together) the second lines 42 formed on the plural layers into a single wiring layer. Therefore, through-holes are formed at pre-specified combination positions on the wiring paths of the second lines 42 in the second region, the second lines 42 that have branched onto the three wiring layers are combined onto, for example, the first layer at the combination positions, and the end portions of the second lines 42 are connected to the respective second output pads 14B.

Thus, because the second lines 42 are formed with the number of wiring layers used for forming each of the second lines 42 being made greater than the number of wiring layers used for forming each of the first lines 41, wiring resistance values of the second lines 42 may be suppressed.

When the second output pads 14B are formed along the fourth edge 34 too, the same effect as described above is provided by forming the second lines 42 using plural wiring layers as described above.

The present invention is not to be limited by the semiconductor device of the above-described exemplary embodiment. For example, the second lines 42 may be formed using only one wiring layer in the region along the third edge 33 and formed using plural wiring layers only in the region along the second edge 32.

-Other Exemplary Embodiments-

Further, the respective plural second lines 42 may be formed in a wiring layer at an upper layer relative to the respective plural first lines 41. It is common for wiring layers laminated in a semiconductor device to have thicker layer thicknesses at higher levels (with line thicknesses being thicker). Therefore, by the respective plural second lines 42 being formed in a wiring layer at a higher layer than the respective plural first lines 41, the line thickness for a unit of wiring length of each of the second lines 42 may be made thicker than for the first lines 41, and the wiring resistances per unit of wiring length may be suppressed.

Further again, the respective plural second lines 42 may be formed of a material with a lower resistivity than that of the respective plural first lines 41. For example, in plural wiring layers, a first layer is a wiring layer formed with copper, a second wiring layer is a wiring layer formed with aluminium, the respective second lines 42 are formed in the first layer, and the respective first lines 41 are formed in the second layer. Copper is a material with a lower resistivity than aluminium. Therefore, by the second lines 42 being formed of the material with low resistivity, the wiring resistances per unit of wiring length may be suppressed lower than in the first lines 41.

Note that the second lines 42 may be formed by a method combining any two or more of the method of forming the second lines 42 with broader line widths described in the first exemplary embodiment, the method of forming the second lines 42 using plural wiring layers described in the second exemplary embodiment, and the method of forming the second lines 42 with a thicker line thickness and the method of forming the second lines 42 of a material with lower resistivity described under "Other Exemplary Embodiments".

Following from the above description and embodiments, it should be apparent to those of ordinary skill in the art that, while the methods and apparatuses herein described constitute exemplary embodiments of the present disclosure, the disclosure is not necessarily limited to the precise embodiments and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the disclosure discussed herein in order to fall within the scope of any claims, since the invention is defined by the claims and since inherent and/or unforeseen advantages of the present disclosure may exist even though they may not have been explicitly discussed herein.

What is claimed is:

1. A semiconductor device comprising: a plurality of first output pads formed along a first edge of an outer periphery of the semiconductor device; a plurality of second output pads formed along a second edge at an opposite side of the semiconductor device from the first edge, and a third edge adjoining the first edge and the second edge; a plurality of internal circuits, each of which is provided with an output terminal connected with an output pad of one of the first output pads and the second output pads, the plural internal circuits being formed along the first edge at a central portion of the semiconductor device such that the output terminals are formed along a straight line and are respectively arranged along a side of the internal circuits at which the first edge is disposed; wherein the plurality of internal circuits comprises a leftmost internal circuit located farthest to the left of the plurality of internal circuits; a plurality of first lines, each of which connects one of the output terminals of the plurality of internal circuits with one of the plurality of first output pads; and a plurality of second lines, each of which connects one of the output terminals of the plurality of internal circuits with one of the plurality of second output pads, resistance values per unit of wiring length being lower in the second lines than in the first lines; wherein each of the plurality of second lines extends on the left of the leftmost internal circuit to reach the second output pad.

2. The semiconductor device according to claim 1, wherein the plurality of second lines are formed such that line widths per unit of wiring length of the plurality of second lines are broader than line widths per unit of wiring length of the plurality of first lines.

3. The semiconductor device according to claim 2, wherein the plurality of second lines are formed such that the line widths thereof are broader in regions in which wiring densities are lower.

4. The semiconductor device according to claim 1, wherein a plurality of wiring layers are laminated on the semiconductor device, and the plurality of second lines are formed such that numbers of the wiring layers used for forming the plurality of second lines are greater than numbers of the wiring layers used for forming the plurality of first lines.

5. The semiconductor device according to claim 4, wherein the plurality of second lines are formed such that the numbers of the wiring layers that are used are greater in regions in which wiring densities are lower.

6. The semiconductor device according to claim 1, wherein the plurality of second lines are formed such that line thicknesses per unit of wiring length of the plurality of second lines are thicker than line thicknesses per unit of wiring length of the plurality of first lines.

7. The semiconductor device according to claim 1, wherein the plurality of second lines are formed of a material with a lower resistivity than the plurality of first lines.

8. A semiconductor device comprising: a plurality of first output pads formed on and along a first edge of an outer periphery of a semiconductor device; a plurality of second output pads formed on and along a second edge of the semiconductor device opposite the first edge; a plurality of third output pads formed on and along a third edge of the semiconductor device that interposes the first and second edges; a plurality of internal circuits, each of which is provided with an output terminal in electrical communication with an output pad of one of the plurality of first output pads, the plurality of second output pads, and the plurality of third output pads; wherein the output terminals are formed along a straight line; a plurality of first lines, each of which connects one of the output terminals of the plurality of internal circuits with one of the plurality of first output pads; and a plurality of second lines, each of which connects one of the output terminals of the plurality of internal circuits with one of the plurality of second output pads; a plurality of third lines, each of which connects one of the output terminals of the plurality of internal circuits with one of the plurality of third output pads; wherein the plurality of internal circuits comprises a leftmost internal circuit located farthest to the left of the plurality of internal circuits; wherein the output terminals are formed nearer the first edge than the second edge; and, wherein resistance values per unit of wiring length are lower in the second lines than in the first lines ; wherein each of the plurality of second lines extends on the left of the leftmost internal circuit to reach the second output pad.

9. A semiconductor device of claim 8, wherein the plurality of first lines and the plurality of second lines share a common dimension of at least one of width and thickness.

10. A semiconductor device of claim 8, wherein: at least a portion of the plurality of first lines, the plurality of second lines, and the plurality of third lines interpose the plurality of first output pads and the plurality of internal circuits; at least a portion of the plurality of second lines interposes the plurality of second output pads and the plurality of internal circuits; and, at least a portion of the plurality of third lines interposes the plurality of third output pads and the plurality of internal circuits.

11. A semiconductor device of claim 8, wherein: at least a portion of the plurality of first lines, the plurality of second lines, and the plurality of third lines interpose the plurality of first output pads and the plurality of internal circuits; at least a portion of the plurality of third lines comprises a first conductive layer overlapping a second conductive layer; and at least a portion of the plurality of second lines comprises a first conductive layer overlapping a second conductive layer, and a third conductive layer overlapping the first conductive layer.

12. A semiconductor device comprising: a plurality of first output pads formed on and along a first edge of an outer periphery of a semiconductor device; a plurality of second output pads formed on and along a second edge of the semiconductor device opposite the first edge; a plurality of internal circuits, each of which is provided with an output terminal connected with an output pad of one of the first output pads and the second output pads; a plurality of first lines, each of which connects one of the output terminals of the plurality of internal circuits with one of the plurality of first output pads; and a plurality of second lines, each of which connects one of the output terminals of the plurality of internal circuits with one of the plurality of second output pads; wherein the output terminals are formed along a straight line; and wherein the plurality of internal circuits comprises a leftmost internal circuit located farthest to the left of the plurality of internal circuits; wherein resistance values per unit of wiring length being lower in the second lines than in the first lines; and, wherein the output terminals are formed on and proximate the first edge of the semiconductor device; wherein each of the plurality of second lines extends on the left of the leftmost internal circuit to reach the second output pad.

* * * * *